United States Patent
Casteel, Jr. et al.

(10) Patent No.: US 9,472,420 B2
(45) Date of Patent: Oct. 18, 2016

(54) COMPOSITION FOR TITANIUM NITRIDE HARD MASK AND ETCH RESIDUE REMOVAL

(71) Applicant: AIR PRODUCTS AND CHEMICALS, INC., Allentown, PA (US)

(72) Inventors: William Jack Casteel, Jr., Emmaus, PA (US); Seiji Inaoka, Macungie, PA (US); Madhukar Bhaskara Rao, Fogelsville, PA (US); Brenda Faye Ross, Whitehall, PA (US); Yi-Chia Lee, Chupei (TW); Wen Dar Liu, Chupei (TW); Tianniu Chen, Westford, MA (US)

(73) Assignee: Air Products and Chemicals, Inc., Allentown, PA (US)

( * ) Notice: Subject to any disclaimer, the term of this patent is extended or adjusted under 35 U.S.C. 154(b) by 80 days.

(21) Appl. No.: 14/547,864

(22) Filed: Nov. 19, 2014

(65) Prior Publication Data

US 2015/0175943 A1    Jun. 25, 2015

Related U.S. Application Data

(60) Provisional application No. 61/918,943, filed on Dec. 20, 2013.

(51) Int. Cl.
| | |
|---|---|
| H01L 21/3213 | (2006.01) |
| H01L 21/02 | (2006.01) |
| C09K 13/06 | (2006.01) |
| C09K 13/08 | (2006.01) |
| H01L 21/311 | (2006.01) |

(52) U.S. Cl.
CPC ......... *H01L 21/32134* (2013.01); *C09K 13/06* (2013.01); *C09K 13/08* (2013.01); *H01L 21/02063* (2013.01); *H01L 21/31144* (2013.01)

(58) Field of Classification Search
CPC ............... C11D 11/0047; H01L 21/28088
See application file for complete search history.

(56) References Cited

U.S. PATENT DOCUMENTS

| | | | |
|---|---|---|---|
| 6,030,932 A * | 2/2000 | Leon .................. | C11D 1/62 510/175 |
| 6,821,352 B2 * | 11/2004 | Rovito ................ | C09K 13/00 134/25.4 |
| 7,399,365 B2 * | 7/2008 | Aoyama .............. | C11D 7/08 134/2 |
| 7,479,474 B2 | 1/2009 | Cernat et al. | |
| 7,928,046 B2 | 4/2011 | Illardi et al. | |
| 9,222,018 B1 * | 12/2015 | Casteel, Jr. ........... | C09K 13/08 |
| 2001/0048161 A1 | 12/2001 | Chopra et al. | |
| 2005/0194564 A1 | 9/2005 | Fujita et al. | |
| 2009/0131295 A1 | 5/2009 | Cui | |
| 2010/0035435 A1 | 2/2010 | Tews et al. | |
| 2010/0163788 A1 | 7/2010 | Visintin et al. | |
| 2012/0058644 A1 | 3/2012 | Klipp | |
| 2013/0157472 A1 | 6/2013 | Cui | |
| 2013/0296214 A1 | 11/2013 | Barnes et al. | |

FOREIGN PATENT DOCUMENTS

| | | |
|---|---|---|
| CN | 103000509 | 3/2013 |
| CN | 103295879 | 9/2013 |
| CN | 103525599 | 1/2014 |
| EP | 0052787 | 6/1982 |
| JP | 2005232559 A | 9/2005 |
| JP | 2008547202 | 12/2008 |
| JP | 2009019255 A | 1/2009 |
| JP | 2009527131 | 7/2009 |
| JP | 2013516064 A | 5/2013 |
| WO | 2009064336 A1 | 5/2009 |
| WO | 2012009639 A2 | 1/2012 |
| WO | 2012048079 A2 | 4/2012 |
| WO | 2013025619 A2 | 2/2013 |
| WO | 2013101907 A1 | 7/2013 |
| WO | 2013138276 A1 | 9/2013 |

* cited by examiner

*Primary Examiner* — Gregory Webb
(74) *Attorney, Agent, or Firm* — Lina Yang

(57) ABSTRACT

Aqueous compositions for stripping titanium nitride (TiN or TiNxOy) hard mask and removing etch residue are low pH aqueous composition comprising solvent, a weakly coordinating anion, amine, and at least two non-oxidizing trace metal ions. The aqueous compositions contain no non-ambient oxidizer, and are exposed to air. Bifluoride, or metal corrosion inhibitor may be added to the aqueous composition. Systems and processes use the aqueous compositions for stripping titanium nitride (TiN or TiNxOy) hard mask and removing titanium nitride (TiN or TiNxOy) etch residue.

21 Claims, No Drawings

COMPOSITION FOR TITANIUM NITRIDE HARD MASK AND ETCH RESIDUE REMOVAL

CROSS REFERENCE TO RELATED PATENT APPLICATIONS

The present patent application claims the benefit of U.S. Provisional Patent Application Ser. No. 61/918,943 filed Dec. 20, 2013.

BACKGROUND OF THE INVENTION

As scaling continues to ever smaller feature sizes, integrated circuit (IC) reliability is an increasing concern in IC fabrication technology. The impact of trace interconnect failure mechanisms on device performance and reliability demand much more from integration schemes, interconnect materials, and processes. An optimal low-k dielectric material and their related deposition, pattern lithography, etching and cleaning are required to form dual-damascene interconnect patterns fabrication processes. A hard-mask scheme approach of interconnects patterning of wafer fabrication is the ability to transfer patterns into under layers with tightest optimal dimension control.

As technology nodes advance to nanotechnology, metal hard-mask materials such as TiN are used to gain better etching selectivity, better pattern retention and profile control to the low-k materials during the pattern etching process.

Compositions have been developed to pullback or remove these types of metal hard-masks from substrates.

The following patents are representatives.

US2013/0157472 describes the compositions comprising $Cl^-$, or $Br^-$ an oxidizer and potentially a Cu corrosion inhibitor to clean substrates containing low-k dielectric and Cu and to etch a TiN or TiNxOy hard mask and tungsten. The composition typically contains 6% hydrogen peroxide as the oxidizer and diglycolamine to adjust the pH to >7.

US 2009/0131295 A1 describes the removal of hard mask residues (typically TiF containing) after plasma etch from TiN at a pH of 1-8 using acidic or basic fluoride or bifluoride.

U.S. Pat. No. 7,479,474 B2 describes cleaning compositions comprising $H_2SiF_6$ or $HBF_4$ to reduce oxide etch in a substrate comprising low-K dielectric.

WO 2013/101907 A1 describes compositions comprising etchants including hexafluorosilicic acid and hexafluorotitanate, at least one oxidant including high valent metals, peroxide or high oxidation state species and at least one solvent.

BRIEF SUMMARY OF THE INVENTION

The present invention relates to composition, system and process for selectively etching hard mask layers and/or etch residues relative to metal conductor layers and low-k dielectric layers that are present. More specifically, the present invention relates to a composition, system and process for selectively etching a titanium nitride hard mask and/or etch residues relative to tungsten, copper and low-k dielectric layers including silicon dielectrics and aluminum dielectrics.

In one aspect, an aqueous composition for selectively removing titanium nitride (TiN or TiNxOy; where x=0 to 1.3 and y=0 to 2) from a semiconductor device comprising Cu, W, low-k dielectric material and titanium nitride, comprising:

a weakly coordinating anion having negative charge highly dispersed throughout its structure;
an amine salt buffer;
at least two non-oxidizing trace metal ions; and
the remaining being solvent selected from the group consisting of water, glycol, propylene glycol, lactic acid, acetic acid, sulfolanes, dimethyl sulfoxide, alkyl sulfone, and combinations thereof;
wherein the aqueous composition (1) contains no non-ambient oxidizer; (2) is exposed to air; and (3) has a pH less than 7.

In another aspect, a system for selectively removing titanium nitride (TiN or TiNxOy; where x=0 to 1.3 and y=0 to 2) from a surface of a microelectronic device, comprising:

the semiconductor device comprising Cu, W, low-k dielectric material and the titanium nitride;
an aqueous composition for selectively removing titanium nitride from the semiconductor device comprising:
a weakly coordinating anion;
an amine salt buffer;
at least two non-oxidizing trace metal ions; and
the remaining being solvent selected from the group consisting of water, glycol, propylene glycol, lactic acid, acetic acid, sulfolanes, dimethyl sulfoxide, alkyl sulfone, and combinations thereof;
wherein the aqueous composition (1) contains no non-ambient oxidizer; (2) is exposed to air; and (3) has a pH less than 7;
and
the titanium nitride is in direct contact with the aqueous composition but is not in direct in contact with W.

In yet another aspect, a process of selectively removing titanium nitride (TiN or TiNxOy; where x=0 to 1.3 and y=0 to 2) from a microelectronic device comprising Cu, W, low-k dielectric material and the titanium nitride, comprising:

contacting the semiconductor device with an aqueous composition comprising:
a weakly coordinating anion;
an amine salt buffer;
at least two non-oxidizing trace metal ions;
the remaining being solvent selected from the group consisting of water, glycol, propylene glycol, lactic acid, acetic acid, sulfolanes, dimethyl sulfoxide, alkyl sulfone, and combinations thereof; and
the aqueous composition (1) contains no non-ambient oxidizer; (2) is exposed to air; and (3) has a pH less 7;
and
removing the titanium nitride;
wherein the titanium nitride is in direct contact with the aqueous composition but is not in direct in contact with W.

The weakly coordinating anion has negative charge highly dispersed throughout its structure, and is selected from the group consisting of p-toluenesulfonate $(C_7H_8SO_3^-)$; sulfate $(SO_4^{2-})$; nitrate $(NO_3^-)$; triflate $(CF_3SO_3^-)$; perfluorosulfonates $(R_fSO_3^-)$, in $R_f$ is a perfluoroalkylgroup from $C_1$ to $C_4$); perfluorosulfonimides; $((R_f)_2NSO_2^-)$, wherein $R_f$ is a perfluoroalkylgroup from $C_1$ to $C_4$); hexafluorosilicate $(SiF_6^{2-})$; hexafluorotitanate $(TiF_6^{2-})$; tetrafluoroborate $(BF_4^-)$; hexafluorophosphate $(PF_6^-)$; hexafluoroantimonate $(SbF_6^-)$; perfluoroalkylaluminates $((R_fO)_4Al^-)$, wherein $R_f$ is a perfluoroalkyl group; and combinations thereof.

The amine salt buffer is selected from the group consisting of ammonium chloride; ammonium bisulfate; ammonium phosphates; ammonium oxalate; ammonium perfluorosulfonates; ammonium tetrafluoroborate; ammonium hexafluorotitanate or ammonium hexafluorosilicate (which may be formed from ammonium hydroxide and hexafluorosilicic acid); and ammonium salts of organic acid selected from the group consisting of ammonium citrate; ammonium acetate; ammonium lactate; and combinations thereof. By ammonium is meant a salt of any amine of the form $N(R^1R^2R^3R^4)^+$, wherein $R^1$, $R^2$, $R^3$, $R^4$ may all be the same or different, and may independently constitute H, $CH_3$, $C_2H_5$, $C_3H_7$.

The non-oxidizing trace metal ion is selected from the group consisting of Fe(II) ion, Cu(I) ion, Cu(II), Co(II) ion, Cr(II) ion, Mn(II) ion, Ni(II) ion and combinations thereof. The present invention uses "at least two non-oxidizing trace metal ions" for at least two different types of non-oxidizing trace metal ions.

The solvent is selected from the group consisting of water; glycol; propylene glycol; lactic acid; acetic acid; sulfolanes; dimethyl sulfoxide; alkyl sulfone; and combinations thereof. Preferred solvent is water, such as deionized water.

The aqueous composition may further comprises a corrosion inhibitor selected from the group consisting of benzotriazole and substituted benzotriazole; alkyl amine and alkyl amine including hexyl and octyl amine; polyethyleneimine and polyethyleneimine with carboxylic acids including citric and malonic acid; imidazole; cysteine and substituted cysteine; cystine and substituted cystine; triazole and substituted triazole; iminodiacetic acid; thiourea; benzimidazole; vanillin; catechols; and combinations thereof.

The aqueous composition may further comprise solvolyzing bifluoride.

Other aspects, features and embodiments of the invention will be more fully apparent from the ensuing disclosure and appended claims.

DETAILED DESCRIPTION OF THE INVENTION

In general, the present invention relates to compositions, systems and processes for selectively etching hard mask layers and/or photoresist etch residues relative to metal conductor layers and low-k dielectric layers including silicon dielectrics and aluminum dielectrics that are present.

Specifically, this invention describes composition, systems and processes offer high titanium nitride (TiN or TiNxOy; where x=0 to 1.3 and y=0 to 2) hard mask removal rate without damage to the metal layer, such as tungsten and other metal layer components.

Etch selectivity is defined as the ratio of the etch rate of the target material being etched to/vs. the etch rate of other materials Etch Selectivities of >10:1 of titanium nitride vs. W or titanium nitride vs. low-k dielectric are achieved. Preferably etch selectivities of >20:1 of titanium nitride vs. W or titanium nitride vs. low-k dielectric are achieved. More preferably etch selectivities of >50:1 of TiN vs. W or titanium nitride vs. low-k dielectric are achieved.

Compositions, strippers, or formulations (compositions, strippers, and formulations are interchangeable here) designed for the removal of titanium nitride hard mask materials after wafer patterning typically use hydrogen peroxide as an oxidant. Chemistries involving hydrogen peroxide as an oxidizing agent for titanium nitride hard mask removal have proven effective, but appear to be incompatible with tungsten metal in the metal layer of the wafer. The compositions often etch tungsten even more readily than the desired titanium nitride hard mask. When hydrogen peroxide is used as an oxidant under slightly basic conditions to solubilize the titanium nitride as titanium peroxide species, unfortunately the metal layer metal, such as tungsten, also readily forms soluble peroxides and is attacked by these chemistries.

The chemistry of this invention avoids the use of any non-ambient oxidizers, including hydrogen peroxide. This invention, more specifically, describes a new no non-ambient oxidizing platform of compositions for titanium nitride hard mask removal on 28 nm wafers and smaller nodes. This aspect of the invention makes the chemistry much more compatible with tungsten.

Air at atmospheric conditions is an example of a mild ambient oxidizer. The term non-ambient oxidizer includes any oxidizer that is not air or oxygen in air.

Since air at atmospheric conditions is normally present during tool operation, a non-ambient oxidizer is meant to describe any oxidizer component of a formation must be added intentionally to the composition.

The invention uses a low pH aqueous composition comprising a weakly coordinating anion, amine, in the presence of air and at least two non-oxidizing trace metal ions, to remove the titanium nitride hard mask without etching tungsten. Nor does this chemistry etch the TiN liner between the tungsten and low-k dielectric layers. The invention uses "at least two non-oxidizing trace metal ions" for at least two different types of non-oxidizing trace metal ions.

The compositions contain a weakly coordinating anion in either the acidic form or an amine substituted form. A weakly coordinating anion has negative charge highly dispersed throughout its structure and so is designed to stabilize and keep very reactive cations, such as those of dissolved titanium nitride, in aqueous composition.

The weakly coordinating anion may include, but is not limited to, p-toluenesulfonate ($C_7H_8SO_3^-$); sulfate ($SO_4^{2-}$); nitrate ($NO_3^-$); triflate ($CF_3SO_3^-$); perfluorosulfonates ($R_fSO_3^-$), in $R_f$ is a perfluoroalkylgroup from $C_1$ to $C_4$); perfluorosulfonimides; (($R_f)_2NSO_2^-$), wherein $R_f$ is a perfluoroalkylgroup from $C_1$ to $C_4$); hexafluorosilicate ($SiF_6^{2-}$); hexafluorotitanate ($TiF_6^{2-}$); tetrafluoroborate ($BF_4^-$); hexafluorophosphate ($PF_6^-$); hexafluoroantimonate ($SbF_6^-$); perfluoroalkylaluminates (($R_fO)_4Al^-$), wherein $R_f$ is a perfluoroalkyl group; and combinations thereof.

The amount of the weakly coordinating anion is in the range of 1-10 wt %, preferably 2-8 wt %, and more preferably 4-8 wt %

The compositions comprise an amine salt buffer. The amine salt buffer may include, but is not limited to, ammonium chloride; ammonium bisulfate; ammonium phosphates; ammonium oxalate; ammonium perfluorosulfonates; ammonium tetrafluoroborate; ammonium hexafluorotitanate or ammonium hexafluorosilicate (which may be formed from ammonium hydroxide and hexafluorosilicic acid); and ammonium salts of organic acid selected from the group consisting of ammonium citrate; ammonium acetate; ammonium lactate; and combinations thereof. By ammonium is meant a salt of any amine of the form $N(R_1R^2R^3R^4)^+$, wherein $R^1$, $R^2$, $R^3$, $R^4$ may all be the same or different, and may independently constitute H, $CH_3$, $C_2H_5$, $C_3H_7$.

The amount of the amine salt buffer is in the range of 0.5-10 wt %, preferably 1-10 wt %, and more preferably 2-8 wt %.

The compositions contain at least two non-oxidizing trace metal ions, that is, at least two different types of non-oxidizing trace metal ions.

which can exist in multiple oxidation states, as oxidation catalysts.

The compositions are also exposed to ambient air.

The non-oxidizing trace metal ions in the presence of air serve to catalyze the action of air as an oxidant in this system. In the absence of these non-oxidizing trace metal ions, the air oxidation is a slow process, and thus the etch rate for titanium nitride is slow, while at the same time the dissolved non-oxidizing trace metal ions do not accelerate the titanium nitride etch rate in the absence of normally present air.

The non-oxidizing trace metal ions, also called oxidation catalysts, or redox active metal ions, may include, but are not limited to, Fe(II) ion, Cu(I) ion, Cu(II), Co(II) ion, Cr(II) ion, Mn(II) ion or Ni(II) ion as components of stable aqueous compositions at low pH<4. Typically these components will be added as salts in the form of chlorides or sulfates, but other salts may be used; or these components may be added from controlled etching of the target metals by the composition.

The non-oxidizing trace metal ions as oxidation catalysts are used in amounts of <250 ppm, preferably <100 ppm, and more preferably <50 ppm.

The compositions may further contain solvolyzing bifluoride at quantities <4000 ppm, or <2000 ppm, or <500 ppm, depending on the stability of the oxide, e.g., TEOS layer, or other low-k dielectric layers.

The compositions may contain corrosion inhibitors to improve compatibility at other metals.

The corrosion inhibitor may include, but is not limited to benzotriazole and substituted benzotriazole; alkyl amine and alkyl amine including hexyl and octyl amine; polyethyleneimine and polyethyleneimine with carboxylic acids including citric and malonic acid; imidazole; cysteine and substituted cysteine; cystine and substituted cystine; triazole and substituted triazole; iminodiacetic acid; thiourea; benzimidazole; vanillin; catechols; and combinations thereof.

The corrosion inhibitor is used in amounts of <2000 ppm, preferably <1000 ppm and more preferably <100 ppm.

The rest of the composition is solvent. The solvent is selected from the group consisting of water; glycol; propylene glycol; lactic acid; acetic acid; sulfolanes; dimethyl sulfoxide; alkyl sulfone; and combinations thereof. Preferred solvent is water, such as deionized water.

The compositions have a pH<7; preferably pH<4; more preferably pH<2, and most preferably pH<1.5.

In addition to their high titanium nitride hard mask etch rate and compatibility with tungsten of the metal layer, one unique property of the compositions of this invention is that titanium nitride etches much more slowly when it is galvanically coupled with tungsten. By galvanically coupled it is meant that the titanium nitride and W are in direct contact with each other in the presence of an electrically conducting composition containing dissolved ions such as those described herein. This aspect of the invention is extremely important, because it allows the compositions to rapidly remove a titanium nitride hard mask without damaging the TiN liner that lies directly between the W and the low-k dielectric layers of a patterned wafer.

The compositions of this invention offer the following advantages.
 1. High etch rates of titanium nitride are observed at 70° C. and lower.
 2. Aqueous solutions of the compositions are stable.
 3. Low active fluoride containing compositions show low TEOS etch and patterned PDEMs 2.2 damage.
 4. Essentially no etch of tungsten (W) is observed, so compositions of this platform are compatible with and may be used in cleaning the metal layer.
 5. The compositions do not damage the TiN liner between the tungsten and the low-k dielectric layers.

WORKING EXAMPLES

All concentrations of components are wt. % unless otherwise indicated.

All experiments described below were run using the equipment and materials as listed below.

Non-oxidizing trace metal ions were added in the aqueous composition by either introducing known amounts of Fe(II) $Cl_2$, Fe(II)$SO_4$, Cu(II)$Cl_2$ or Cu(II)$SO_4$, Ni(II)$Cl_2$ or by dissolving known thicknesses of Cu metal coupons or carbon steel coupons.

Wafers of varying types of TiN, W, TEOS and typical ILD materials were immersed in the aqueous compositions with 500 rpm stirring and heating to 60 or 70° C. Immersion times were varied depending on the etch rates.

Etch rates for metals were determined by determining film thicknesses before and after the etch process by sheet resistivity on a CDE ResMap 273 (Manufacturer: Creative Design Engineering, Inc. 20565 Alves Drive Cupertino, Calif. 95014). Etch rates for the ILD and TEOS were measured by before and after thicknesses on a SCI FilmTeK Ellipsometer 2000SE (Manufacturer:Scientific Computing International; 6355 Corte Del Abeto Suite C-105; Carlsbad, Calif. 92011).

Example 1

Aqueous compositions were prepared by blending the components as described in Table 1.

Titanium nitride stripping studies at 70° C. using hexafluorosilicic acid as acid salt of the weakly coordinating anion hexafluorosilicate, triammonium citrate or ammonium chloride as the amine buffer, Cu(II) ion and Fe(II) ion as as "at least two non-oxidizing trace metal ions", was also shown in Table 1.

This example has shown the following several features.

The combination of the weakly coordinating anion, ammonium buffer, non-oxidizing trace metal ions and air used were compatible with the metal layer metal, tungsten and dielectric components of the metal layer.

A range of ammonium buffer systems were effective in this chemistry, including triammonium citrate, ammonium chloride and ammonium hydroxide buffered with hexafluorosilicic acid Hexafluorosilicic acid was effective as an acid containing a weakly coordinating anion in this chemistry.

The combination of 2 non-oxidizing metals, Fe(II) ion and Cu(II) ion with air were critical to obtaining the maximum titanium nitride tech rate on very refractory TiN.

TABLE 1

|  | wt. % or ppm | 39D | 41L | 41L + trace copper | 44D + Cu |
|---|---|---|---|---|---|
| DIW | Wt. % | 75.9 | 88.1 | 88.1 | 92.5 |
| Hexafluorosilicic acid | Wt. % | 4 | 6 | 6 | 6 |
| Hydrochloric acid | Wt. % | 0.2 | 3 | 3 | 0 |

TABLE 1-continued

|  | wt. % or ppm | 39D | 41L | 41L + trace copper | 44D + Cu |
|---|---|---|---|---|---|
| Triammonium citrate | Wt. % | 5.2 | 0 | 0 | 0 |
| Citric acid | Wt. % | 14.7 | 0 | 0 | 0 |
| Ammonium hydroxide | Wt. % | 0 | 2.9 | 2.9 | 1.5 |
| Cu(II) | ppm | 0 | 0 | 0.5 | 6 |
| Fe(II)SO$_4$ | ppm | 20 | 20 | 80 | 20 |
| Air | Yes/no | yes | yes | yes | yes |
| Post-plasma TiN Etch rate | (Å/min) 1, 2 min | 24 | 44 | 94 | 63 |
| W Etch | (Å/min) 10 min | 1 | 0.2 | 1.7 | 0.5 |
| TEOS Etch | (Å/min) 5, 10 min | 0.1 | 0.5 | — | 1 |
| ULK ILD Etch | (Å/min) 5, 10 | 0.1 | 0.5 | 10 | 1 |

The weakly coordinating acid anion hexafluorosilicate appeared to help keeping dissolved titanium nitride in solution.

The amine salt buffer system was used to maintain the pH near 1 and also as a co-etchant.

Etch selectivities for TiN vs. W; and TiN vs. TEOS of >50:1 were achieved in working compositions of present invention.

Example 2

Aqueous compositions were prepared by blending the components as described in Table 2.

Titanium nitride stripping studies were performed in this example at 70° C. in air. The aqueous compositions were prepared using hexafluorosilicic acid as acid salt of the weakly coordinating anion hexafluorosilicate, ammonium chloride as the amine salt buffer and various non-oxidizing trace metal ions.

This example has shown the following several features.

While etch performance for TiN was very slow for a composition in the absence of any non-oxidizing trace metal ions, and/or when one of the non-oxidizing trace metal ions, such as, Cu(II) ion or Fe(II) ion was added alone. However, when two or more types of the non-oxidizing trace metal ions added together, such as, Cu(II) ion and Fe(II) ion; Ni(II) ion and Fe(II) ion; Cu(II) ion and Ni(II); or Cu(II) ion, Ni(II) ion and Fe(II) ion; had a synergistic role in enhancing the TiN etch rate of post-plasma etched TiN in air.

Thus, the aqueous compositions need to have at least two different types of non-oxidizing trace metal ions.

Etch selectivities for TiN vs. W and TiN vs. low k of >20:1 were achieved in working compositions of present invention.

Comparative Example 3

Aqueous compositions were prepared by blending the components as described in Table 3.

The data for comparative example 3 was also shown in Table 3. In this example, data was taken in two different conditions: when air was present; and when oxygen was removed from the air in the system by adding ascorbic acid and antioxidant.

The results of the data from example 3 has shown that if the oxygen in ambient air was effectively removed from the system, the etch rate for titanium nitride was greatly suppressed.

TABLE 3

|  | wt % or ppm | 41 L + Fe(II)SO$_4$ + Cu(II) + Ni(II) | 41 L + Fe(II)SO$_4$ + Cu(II) + Ni(II) |
|---|---|---|---|
| DIW | wt % | 88.1 | 88.1 |
| Hexafluorosilicic acid | wt % | 6 | 6 |
| Ammonium chloride | wt % | 4.4 | 4.4 |
| Ammonium fluoride | wt % | 0.15 | 0.15 |
| Cu(II) | ppm | 5 | 5 |
| Fe(II)SO$_4$ | ppm | 20-80 | 20-81 |
| Fe(II)Cl$_2$ | ppm | 0 | 0 |
| Ni(II) | ppm | 1 | 1 |
| air |  | yes | no (removed with ascorbic acid) |
| TiN etch rate | Å/min | 106 | 6 |
| W etch rate | Å/min | 2 | not determined |
| ULK etch rate | Å/min | 5 | not determined |

Thus, the aqueous compositions need to be exposed to air, or the oxygen in the air.

TABLE 2

|  | wt % or ppm | 41 L + no trace components | 41 L + Cu(II) | 41 L + Fe(II)SO$_4$ | 41 L + Fe(II)SO$_4$ + Ni(II) | 41 L + Fe(II)SO$_4$ + Cu(II) | 41 L + Fe(II)SO$_4$ + Cu(II) + Ni(II) | 88A + Fe(II)Cl$_2$ + Cu(II) |
|---|---|---|---|---|---|---|---|---|
| DIW | wt % | 88.1 | 88.1 | 88.1 | 88.1 | 88.1 | 88.1 | 90.3 |
| Hexafluorosilicic acid | wt % | 6 | 6 | 6 | 6 | 6 | 6 | 6 |
| Ammonium chloride | wt % | 4.4 | 4.4 | 4.4 | 4.4 | 4.4 | 4.4 | 3.5 |
| Ammonium fluoride | wt % | 0.15 | 0.15 | 0.15 | 0.15 | 0.15 | 0.15 | 0.15 |
| Cu(II) | ppm | 0 | 0.5 | 0 | 0 | 5 | 5 | 2 |
| Fe(II)SO$_4$ | ppm | 0 | 0 | 280 | 20-80 | 100 | 20-80 | 0 |
| Fe(II)Cl$_2$ | ppm | 0 | 0 | 0 | 0 | 0 | 0 | 30 |
| Ni(II) | ppm | 0 | 0 | 0 | 1 | 0 | 1 | 0 |
| air |  | yes | yes | yes | yes | yes | yes | yes |
| TiN etch rate | Å/min | 6 | 10 | 9 | 44 | 94 | 106 | >100 |
| W etch rate | Å/min | 1 | 0.5 | 0.2 | 0.2 | 1 | 2 | 13 |
| ULK etch rate | Å/min | 0.1 | Not measured | 0.5 | 0.5 | 10 | 5 | 10 |

Example 4

Ammonium Hexafluorotitanate on Nitrogen Deficient TiN$_x$(where x<1) Blanket Wafers Aqueous compositions 14a and 14b comprising ammonium hexafluorotitanate were prepared by blending the components as described in Table 4.

By comparison, aqueous composition 20D comprising no ammonium hexafluorotitanate was also prepared by blending the components as described in Table 4.

All aqueous compositions listed in Table 4 comprised bifluoride.

TABLE 4

|  | 14a | 14b | 20D |
|---|---|---|---|
| DIW | 94% | 95% | 99.95% |
| ammonium hexafluorotitanate | 6% | 5% | 0% |
| ammonium bifluoride | 160 ppm | <20 ppm | 500 ppm |
| pH (100%) | 3.2 | 3.6 | 3.2 |
| Cu etch rate (Å/min) | 7 | 2 | 33 |
| Soft TiN etch rate (Å/min) | 120 | 50 | 90 |
| W etch rate (Å/min) | 0 | Not determined | Not determined |
| TEOS etch rate (Å/min) | 0 | Not determined | 7 |

Aqueous composition 20D having 500 ppm of bifluoride alone also etched certain TiN samples, however, the same solution etched Cu and TEOS much more quickly than the aqueous compositions 14a and 14b which having ammonium hexafluorotitanate also.

Example 5

Suppression of TiN Etch Rate Through Galvanic Coupling to W

An etch study was carried out using the same aqueous compositions as in example 1. However, the TiN and the W blanket wafer were galvanically coupled to each other before immersing in the aqueous compositions. The coupling was maintained during the immersing process.

In the case the coupling was achieved by clipping the corners of the wafers together so that a small portion of the tungsten face was contacting a small portion of the TiN face. The thicknesses of the W and TiN wafers were measured before and after etching as explained in example 1.

A comparison of the non-coupled and galvanically coupled etch rates were shown in Table 5.

The results of this example showed that the titanium nitride etch rate was high while W etch rate was low for the non coupled system which mimics the etching of the titanium nitride hard mask in the presence of W.

However, when the TiN and W were galvanically coupled, the etch rates of both the Tin and W were low. This mimics the etching of the TiN liner which was directly in contact with the tungsten on the wafer, in between the W and dielectric.

TABLE 5

| Experiments | Detail | TiN Etch rate [Å/min] | W Etch rate [Å/min] |
|---|---|---|---|
| 1" TiN coupon | no Galvanic, 2-min dip at 70? C. | 69.33 | n/a |
| 1" W coupon | no Galvanic, 10-min dip at 70? C. | n/a | 1.37 |
| 1" TiN & 1" W coupons | 2 coupons coupled together, 2-min dip at 70? C. | 1.24 | 0.63 |
| 1" TiN & small W coupons (*1) | 2 coupons coupled together, 2-min dip at 70? C. | 0 (*3) | (*2) |
| Small TiN & 1" W coupons (*1) | 2 coupons coupled together, 2-min dip at 70? C. | (*2) | 0 (*3) |

Notes
(*1): Ratio of exposed area was about 15:1 (larger coupon:smaller coupon)
(*2): Those coupons were too small to set thickness using our 4-point probe
(*3): Those gave small negative numbers but they were well below standard deviation of 4-point probe measurement, therefore they were assumed to show zero etching This example, thus showed that the aqueous compositions of this invention can give high titanium nitride hard mask etch rates without damaging both the W and the TiN line between the W and low-k dielectric layers.

Example 6

Addition of Corrosion Inhibitor

There were two compositions 88A and 88F without and with addition of a tungsten corrosion inhibitor combination listed in Table 6. Composition 88F was prepared by adding tungsten corrosion inhibitor combination-polyethyleneimine with citric acid and malonic acid to 88A.

TABLE 6

|  | assay 100% | 88A wt. % | 88F wt % |
|---|---|---|---|
| DIW | 100% | 68.5 | 57 |
| hexafluorosilicic acid | 25% | 23.3 | 23.3 |
| ammonium chloride | 100% | 3.5 | 3.5 |
| ammonium bifluoride | 10% | 1.5 | 1.5 |
| Copper(II) Chloride | 1000 ppm Cu (II) | 0.2 | 0.2 |
| Iron(II) chloride | 1000 ppm Fe(II) | 3 | 3 |
| polyethyleneimine | 1% | 0 | 10 |
| citric acid | 100% | 0 | 0.5 |
| malonic acid | 100% | 0 | 1 |

TiN and W etch data using those two compositions was listed in Table 7.

TABLE 7

| Etch Rate(Å/min.) | 88A | 88F |
|---|---|---|
| PVD TiN | 75 | 70 |
| W | 15 | 6.5 |

The data in Table 7 has demonstrated that W corrosion inhibitor can significantly lower the W etch rates in the compositions without a large impact on TiN etch rate.

Etch selectivity for TiN vs. W of >10:1 was achieved in working composition of present invention.

The foregoing examples and description of the preferred embodiments should be taken as illustrating, rather than as limiting the present invention as defined by the claims. As will be readily appreciated, numerous variations and combinations of the features set forth above can be utilized without departing from the present invention as set forth in the claims. Such variations were not regarded as a departure from the spirit and scope of the invention, and all such variations were intended to be included within the scope of the following claims.

The invention claimed is:

1. An aqueous composition for selectively removing titanium nitride (TiN or TiNxOy) from a semiconductor device comprising Cu, W, low-k dielectric material and the titanium nitride,
comprising:
a weakly coordinating anion having negative charge highly dispersed throughout its structure;
an amine salt buffer;
at least two non-oxidizing trace metal ions and
the remaining is solvent selected from the group consisting of water, glycol, propylene glycol, lactic acid, acetic acid, sulfolanes, dimethyl sulfoxide, alkyl sulfone, and combinations thereof;
wherein the aqueous composition (1) contains no non-ambient oxidizer; (2) is exposed to air, and (3) has a pH less than 7.

2. The aqueous composition of claim 1, wherein the weakly coordinating anion is in the range of 1.0-10.0 wt %; and is selected from the group consisting of p-toluenesulfonate ($C_7H_8SO_3^-$); sulfate ($SO_4^{2-}$); nitrate ($NO_3^-$); triflate ($CF_3SO_3^-$); perfluorosulfonates ($R_fSO_3^-$), in $R_f$ is a perfluoroalkylgroup from $C_1$ to $C_4$); perfluorosulfonimides; (($R_f)_2NSO_2^-$), wherein $R_f$ is a perfluoroalkylgroup from $C_1$ to $C_4$); hexafluorosilicate ($SiF_6^{2-}$); hexafluorotitanate ($TiF_6^{2-}$); tetrafluoroborate ($BF_4^-$); hexafluorophosphate ($PF_6^-$); hexafluoroantimonate ($SbF_6^-$); perfluoroalkylaluminates (($R_fO)_4Al^-$), wherein $R_f$ is a perfluoroalkyl group; and combinations thereof.

3. The aqueous composition of claim 1, wherein the amine salt buffer is in the range of 0.5-10.0 wt %; and is selected from the group consisting of ammonium chloride; ammonium bisulfate; ammonium phosphates; ammonium oxalate; ammonium perfluorosulfonates; ammonium tetrafluoroborate; ammonium hexafluorotitanate or ammonium hexafluorosilicate (which may be formed from ammonium hydroxide and hexafluorosilicic acid); and ammonium salts of organic acid selected from the group consisting of ammonium citrate; ammonium acetate; ammonium lactate; and combinations thereof;
wherein the ammonium has a form of $N(R^1R^2R^3R^4)^+$; and each of $R^1$, $R^2$, $R^3$, $R^4$ is independently selected from the group consisting of H, $CH_3$, $C_2H_5$, and $C_3H_7$.

4. The aqueous composition of claim 1, wherein each of the at least two non-oxidizing trace metal ions is in the range of <500 ppm; and is independently selected from the group consisting of Fe(II) ion, Cu(I) ion, Cu(II) ion, Co(II) ion, Cr(II) ion, Mn(II) ion, Ni(II) ion, and combinations thereof.

5. The aqueous composition of claim 1 further comprising a corrosion inhibitor in amount of <2000 ppm; and is selected from the group consisting of benzotriazole and substituted benzotriazole; alkyl amine and alkyl amine including hexyl and octyl amine; polyethyleneimine and polyethyleneimine with carboxylic acids including citric and malonic acid; imidazole; cysteine and substituted cysteine; cystine and substituted cystine; triazole and substituted triazole; iminodiacetic acid; thiourea; benzimidazole; vanillin; catechols; and combinations thereof.

6. The aqueous composition of claim 1 further comprising bifluoride in amount of <4000 ppm.

7. The aqueous composition of claim 1, wherein the pH is <4.

8. A system for selectively removing titanium nitride (TiN or TiNxOy) from a microelectronic device, comprising:
the semiconductor device comprising Cu, W, low-k dielectric material and the titanium nitride;
an aqueous composition for selectively removing the titanium nitride from the semiconductor device comprising:
a weakly coordinating anion;
an amine salt buffer;
at least two non-oxidizing trace metal ions and
the remaining is solvent selected from the group consisting of water, glycol, propylene glycol, lactic acid, acetic acid, sulfolanes, dimethyl sulfoxide, alkyl sulfone, and combinations thereof;
wherein the aqueous composition contains (1) contains no non-ambient oxidizer, (2) is exposed to air, and (3) has a pH less than 7; and
the titanium nitride is in direct contact with the aqueous composition but is not in direct in contact with W.

9. The system of claim 8, wherein the weakly coordinating anion is in the range of 1.0-10.0 wt %; and is selected from the group consisting of p-toluenesulfonate ($C_7H_8SO_3^-$); sulfate ($SO_4^{2-}$); nitrate ($NO_3^-$); triflate ($CF_3SO_3^-$); perfluorosulfonates ($R_fSO_3^-$), in $R_f$ is a perfluoroalkylgroup from $C_1$ to $C_4$); perfluorosulfonimides; (($R_f)_2NSO_2^-$), wherein $R_f$ is a perfluoroalkylgroup from $C_1$ to $C_4$); hexafluorosilicate ($SiF_6^{2-}$); hexafluorotitanate ($TiF_6^{2-}$); tetrafluoroborate ($BF_4^-$); hexafluorophosphate ($PF_6^-$); hexafluoroantimonate ($SbF_6^-$); perfluoroalkylaluminates (($R_fO)_4Al^-$), wherein $R_f$ is a perfluoroalkyl group; and combinations thereof.

10. The system of claim 8, wherein the amine salt buffer is in the range of 0.5-10.0 wt %; and is selected from the group consisting of ammonium chloride; ammonium bisulfate; ammonium phosphates; ammonium oxalate; ammonium perfluorosulfonates; ammonium tetrafluoroborate; ammonium hexafluorotitanate or ammonium hexafluorosilicate (which may be formed from ammonium hydroxide and hexafluorosilicic acid); and ammonium salts of organic acid selected from the group consisting of ammonium citrate; ammonium acetate; ammonium lactate; and combinations thereof;
wherein the ammonium has a form of $N(R^1R^2R^3R^4)^+$; and each of $R^1$, $R^2$, $R^3$, $R^4$ is independently selected from the group consisting of H, $CH_3$, $C_2H_5$, and $C_3H_7$.

11. The system of claim 8, wherein each of the at least two non-oxidizing trace metal ions is in the range of <500 ppm; and is independently selected from the group consisting of Fe(II) ion, Cu(I) ion, Cu(II) ion, Co(II) ion, Cr(II) ion, Mn(II) ion, Ni(II) ion, and combinations thereof.

12. The system of claim 8, wherein the aqueous composition further comprising a corrosion inhibitor in amount of <2000 ppm; and is selected from the group consisting of benzotriazole and substituted benzotriazole; alkyl amine and alkyl amine including hexyl and octyl amine; polyethyleneimine and polyethyleneimine with carboxylic acids including citric and malonic acid; imidazole; cysteine and substituted cysteine; cystine and substituted cystine; triazole and substituted triazole; iminodiacetic acid; thiourea; benzimidazole; vanillin; catechols; and combinations thereof.

13. The system of claim 8, wherein the aqueous composition further comprising bifluoride in amount of <4000 ppm.

14. The system of claim 8, wherein the aqueous composition has a pH<4.

15. A process of selectively removing titanium nitride (TiN or TiNxOy) from a microelectronic device comprising Cu, W, low-k dielectric material and the titanium nitride, comprising:
  contacting the semiconductor device with an aqueous composition comprising:
    a weakly coordinating anion;
    an amine salt buffer;
    at least two non-oxidizing trace metal ions and
    the remaining is solvent selected from the group consisting of water, glycol, propylene glycol, lactic acid, acetic acid, sulfolanes, dimethyl sulfoxide, alkyl sulfone, and combinations thereof;
    wherein the aqueous composition contains (1) contains no non-ambient oxidizer, (2) is exposed to air, and (3) has a pH less than 7; and
  removing the titanium nitride;
wherein the titanium nitride is in direct contact with the aqueous composition and is not in direct in contact with W.

16. The process of claim 15, wherein the weakly coordinating anion is in the range of 1.0-10.0 wt %; and is selected from the group consisting of p-toluenesulfonate ($C_7H_8SO_3^-$); sulfate ($SO_4^{2-}$); nitrate ($NO_3^-$); triflate ($CF_3SO_3^-$); perfluorosulfonates ($R_fSO_3^-$), in $R_f$ is a perfluoroalkylgroup from $C_1$ to $C_4$); perfluorosulfonimides; (($R_f$)$_2$NSO$_2^-$), wherein $R_f$ is a perfluoroalkylgroup from $C_1$ to $C_4$); hexafluorosilicate ($SiF_6^{2-}$); hexafluorotitanate ($TiF_6^{2-}$); tetrafluoroborate ($BF_4^-$); hexafluorophosphate ($PF_6^-$); hexafluoroantimonate ($SbF_6^-$); perfluoroalkylaluminates (($R_fO)_4Al^-$), wherein $R_f$ is a perfluoroalkyl group; and combinations thereof.

17. The process of claim 15, wherein the amine salt buffer is in the range of 0.5-10.0 wt %; and is selected from the group consisting of ammonium chloride; ammonium bisulfate; ammonium phosphates; ammonium oxalate; ammonium perfluorosulfonates; ammonium tetrafluoroborate; ammonium hexafluorotitanate or ammonium hexafluorosilicate (which may be formed from ammonium hydroxide and hexafluorosilicic acid); and ammonium salts of organic acid selected from the group consisting of ammonium citrate; ammonium acetate; ammonium lactate; and combinations thereof;
wherein the ammonium has a form of $N(R^1R^2R^3R^4)^+$; and each of $R^1$, $R^2$, $R^3$, $R^4$ is independently selected from the group consisting of H, $CH_3$, $C_2H_5$, and $C_3H_7$.

18. The process of claim 15, wherein each of the at least two non-oxidizing trace metal ions is in the range of <500 ppm; and is independently selected from the group consisting of Fe(II) ion, Cu(I) ion, Cu(II) ion, Co(II) ion, Cr(II) ion, Mn(II) ion, Ni(II) ion, and combinations thereof.

19. The process of claim 15, wherein the aqueous composition further comprising a corrosion inhibitor in amount of <2000 ppm; and is selected from the group consisting of benzotriazole and substituted benzotriazole; alkyl amine and alkyl amine including hexyl and octyl amine; polyethyleneimine and polyethyleneimine with carboxylic acids including citric and malonic acid; imidazole; cysteine and substituted cysteine; cystine and substituted cystine; triazole and substituted triazole; iminodiacetic acid; thiourea; benzimidazole; vanillin; catechols; and combinations thereof.

20. The process of claim 15, wherein the aqueous composition further comprising bifluoride in amount of <4000 ppm.

21. The process of claim 15, wherein the aqueous composition has a pH<4.

* * * * *